United States Patent
Chen et al.

(10) Patent No.: US 12,115,550 B2
(45) Date of Patent: Oct. 15, 2024

(54) DUAL-VALVE AUTOMATIC CALIBRATION SYSTEM AND DUAL-VALVE AUTOMATIC CALIBRATION METHOD

(71) Applicant: KULICKE AND SOFFA HI-TECH CO., LTD., New Taipei (TW)

(72) Inventors: Lu-Min Chen, Taipei (TW); Tsung-Lin Tsai, Taipei (TW)

(73) Assignee: Kulicke and Soffa Hi-Tech Co., Ltd., New Taipei (TW)

( * ) Notice: Subject to any disclaimer, the term of this patent is extended or adjusted under 35 U.S.C. 154(b) by 252 days.

(21) Appl. No.: 17/744,245

(22) Filed: May 13, 2022

(65) Prior Publication Data
US 2023/0364635 A1    Nov. 16, 2023

(51) Int. Cl.
| | | |
|---|---|---|
| B05C 11/10 | (2006.01) | |
| B05C 5/02 | (2006.01) | |
| H05K 13/04 | (2006.01) | |
| H05K 13/08 | (2006.01) | |

(52) U.S. Cl.
CPC ........ B05C 11/1005 (2013.01); B05C 5/0216 (2013.01); B05C 5/027 (2013.01); B05C 11/1021 (2013.01); B05C 11/1026 (2013.01); H05K 13/0469 (2013.01); H05K 13/089 (2018.08)

(58) Field of Classification Search
None
See application file for complete search history.

(56) References Cited

U.S. PATENT DOCUMENTS

| | | | |
|---|---|---|---|
| 9,374,905 B2 | 6/2016 | Reid et al. | |
| 2005/0056215 A1* | 3/2005 | Shimoda | B05C 5/027 |
| | | | 118/500 |
| 2007/0009650 A1* | 1/2007 | Cho | B05C 5/0216 |
| | | | 118/305 |

(Continued)

FOREIGN PATENT DOCUMENTS

| | | |
|---|---|---|
| CN | 208853149 | 5/2019 |
| CN | 112505958 | 3/2021 |

(Continued)

OTHER PUBLICATIONS

Taiwanese Search Report for Taiwanese patent application No. 111117974 completed Oct. 7, 2022.

*Primary Examiner* — Binu Thomas
(74) *Attorney, Agent, or Firm* — Christopher M. Spletzer, Sr.

(57) ABSTRACT

A dual-valve automatic calibration system comprises a primary positioner, a first secondary positioner and a second secondary positioner: the first secondary positioner and the second secondary positioner are connected with a first fluid coating unit and a second fluid coating unit, respectively; the primary positioner comprises a primary X-axis positioner and a primary Y-axis positioner; both the first secondary positioner and the second secondary positioner are connected with the primary X-axis positioner. In contrast to the prior art that a secondary positioner is installed on a primary Z-axis positioner, a dual-valve automatic calibration system contributes to promotion of positioning precision on the Z-axis and reduction of a burden imposed on the Z-axis.

14 Claims, 4 Drawing Sheets

(56) References Cited

U.S. PATENT DOCUMENTS

| | | | | |
|---|---|---|---|---|
| 2008/0296311 A1* | 12/2008 | Read | ................ | H05K 13/0469 |
| | | | | 221/69 |
| 2016/0008835 A1* | 1/2016 | Giusti | ................ | B05C 5/0216 |
| | | | | 118/313 |
| 2019/0193104 A1* | 6/2019 | Ikushima | .............. | B05C 5/0212 |

FOREIGN PATENT DOCUMENTS

| | | |
|---|---|---|
| CN | 113245144 | 8/2021 |
| TW | 201513762 | 4/2015 |
| TW | M531649 | 11/2016 |
| TW | 201739331 | 11/2017 |
| TW | 201739332 | 11/2017 |
| TW | M631214 | 8/2022 |

* cited by examiner

DUAL-VALVE AUTOMATIC CALIBRATION SYSTEM AND DUAL-VALVE AUTOMATIC CALIBRATION METHOD

BACKGROUND OF THE INVENTION

Field of the Invention

The present invention relates to a dual-valve automatic calibration system and a dual-valve automatic calibration method, particularly a dual-valve automatic calibration system and a dual-valve automatic calibration method for an automatic glue dispenser.

Description of the Prior Art

In recent years, the issue of mounting miniature electronic components (for example, chips) on a highly compact PCB precisely and accurately for high-precision mass production has drawn more and more attentions from the industry.

In existing automatic dispensing technologies for mounting electronic components on a substrate, the philosophy based on dual valves for high-efficiency adhesive dispensing is fulfilled with two sets of fluid coating units supplemented by positioners for simultaneous positioning at specific locations and synchronous dispensing.

According to an existing technology for the structure of positioners, a primary positioning structure and a secondary positioning structure are designed: the primary positioning structure includes a primary X-axis positioning structure, a primary Y-axis positioning structure and a primary Z-axis positioning structure such that two sets of fluid coating units are positioned on the X-axis, the Y-axis and the Z-axis simultaneously; the secondary positioning structure, similarly, includes a secondary X-axis positioning structure, a secondary Y-axis positioning structure and a secondary Z-axis positioning structure and is frequently installed on the primary Z-axis positioning structure.

The structural arrangement of above positioners, however, is criticized for the following technical problems:

(1) A secondary positioning structure installed on a primary Z-axis positioning structure imposes an extra burden on the primary Z-axis positioning structure and goes against precision of the primary Z-axis positioning structure.

(2) A primary positioning structure and a secondary positioning structure, both of which involve in Z-axis positioning, interfere with each other and worsen overall positioning precision as well as dispensing efficiency. For example, the overall positioning precision on the Z-axis and the dispensing efficiency are affected when the upward positioning along the Z-axis initiated by a primary positioning structure counteracts the down positioning along the Z-axis initiated by a secondary positioning structure.

(3) The flexibility of relative movements in a specific direction between two sets of fluid coating units, which share a secondary positioning structure, is inadequate. As mentioned previously, the overall positioning precision and the dispensing efficiency are worsened due to interferences between two separate secondary positioning structures installed for the two sets of fluid coating units, respectively.

SUMMARY OF THE INVENTION

The patent applicant deeply comprehending shortcomings and drawbacks in the prior art was devoted to an innovative design and successfully created a dual-valve automatic calibration system and a dual-valve automatic calibration method after years of research.

A dual-valve automatic calibration system in the present disclosure comprises: a first fluid coating unit with which fluids are coated on a first coating zone of a target circuit board; a second fluid coating unit with which fluids are coated on a second coating zone of a target circuit board; a primary positioner which comprises a primary X-axis positioner and a primary Y-axis positioner for movements and primary positioning of the first fluid coating unit as well as the second fluid coating unit in directions of the X-axis and the Y-axis; a first secondary positioner which comprises a first secondary Z-axis positioner and joins the primary X-axis positioner as well as the first fluid coating unit for movements, secondary positioning and automatic calibrations of the first fluid coating unit in the direction of the Z-axis; a second secondary positioner which comprises a secondary X-axis positioner, a secondary Y-axis positioner and a second secondary Z-axis positioner and joins the primary X-axis positioner as well as the second fluid coating unit for movements, secondary positioning and automatic calibrations of the second fluid coating unit in three directions of the X-axis, the Y-axis and the Z-axis.

In one embodiment of the present disclosure, the primary positioner is unable to move both the first fluid coating unit and the second fluid coating unit in the direction of the Z-axis.

In one embodiment of the present disclosure, the first secondary positioner is unable to move the first fluid coating unit in directions of the X-axis and the Y-axis.

In one embodiment of the present disclosure, the second secondary Z-axis positioner in the second secondary positioner joins the primary X-axis positioner and supports the secondary X-axis positioner as well as the secondary Y-axis positioner, both of which are connected with the second fluid coating unit.

In one embodiment of the present disclosure, both the secondary X-axis positioner and the secondary Y-axis positioner in the second secondary positioner join the primary X-axis positioner and support the second secondary Z-axis positioner connected with the second fluid coating unit.

In one embodiment of the present disclosure, the dual-valve automatic calibration system further comprises an optical element with which a first coating zone and a second coating zone on a target circuit board are detected.

In one embodiment of the present disclosure, the optical element comprises a charge coupled device (CCD) and a laser sensor.

A dual-valve automatic calibration method in the present disclosure comprises: information for positions of the first coating zone and the second coating zone on a target circuit board is detected such that the first fluid coating unit (the second fluid coating unit) moves in directions of the X-axis and the Y-axis through the primary positioner for primary positioning; first-error information corresponding to first obliquity or first unevenness of the first coating zone on a target circuit board is detected such that the first fluid coating unit moves in the direction of the Z-axis through the first secondary positioner for secondary positioning and automatic calibrations; second-error information corresponding to second obliquity or second unevenness of the second coating zone on a target circuit board is detected such that the second fluid coating unit moves in directions of the X-axis, the Y-axis and the Z-axis through the second secondary positioner for secondary positioning and automatic calibrations; fluids are coated on the first coating zone and the second coating zone by the first fluid coating unit and the second fluid coating unit, respectively.

In one embodiment of the present disclosure, the primary positioner is unable to move the first fluid coating unit and the second fluid coating unit in the direction of the Z-axis.

In one embodiment of the present disclosure, the first secondary positioner is unable to move the first fluid coating unit in directions of the X-axis and the Y-axis.

Based on the dual-valve automatic calibration system and the dual-valve automatic calibration method, a burden imposed on the Z-axis is reduced for promotion of positioning precision at the Z-axis in contrast to a traditional dual-valve dispensing technology that features a secondary positioner installed on a primary Z-axis positioner.

In one embodiment of the present disclosure, the primary positioning structure is unable to move two sets of fluid coating units in the direction of the Z-axis for interferences between the primary positioning structure and a secondary positioning structure restrained and promotion of overall positioning precision as well as dispensing efficiency.

In one embodiment of the present disclosure, each of two sets of fluid coating units corresponds to a separate secondary positioner, a secondary Z-axis positioner included in the separate secondary positioner for no movement of each fluid coating unit in directions of the X-axis and the Y-axis, and X-axis, Y-axis and Z-axis positioners included in another secondary positioner for interferences between the two sets of secondary positioners restrained and promotion of overall positioning precision as well as dispensing efficiency.

BRIEF DESCRIPTION OF THE DRAWINGS

The techniques of present invention would be more understandable from the detailed description given herein below and the accompanying figures are provided for better illustration, and thus description and figures are not limitative for present invention, and wherein.

DETAILED DESCRIPTION OF THE INVENTION

The present invention is described in embodiments supplemented by drawings hereinafter such that technical features, content, advantages and efficiency are fully understood by persons with common knowledge in the art. It should be mentioned that the drawings in the present disclosure are schematic supplementary diagrams for the patent specification in which a dual-valve automatic calibration system in embodiments may not be drawn to scale exactly as effectuated in the real system and ought not to be interpreted as evidences to limit claims hereinafter according to the scale and/or the layout in drawings.

Figure 1:
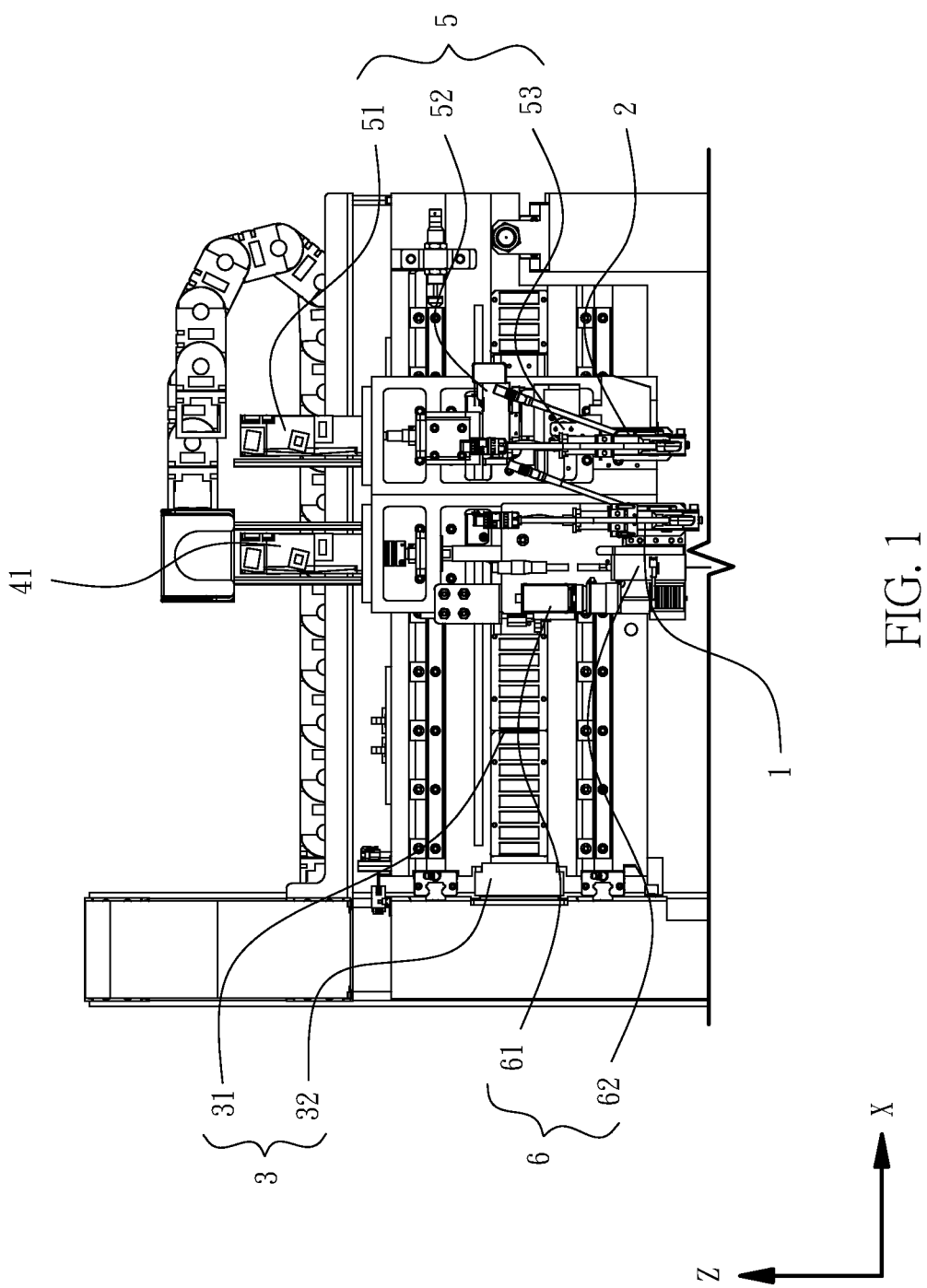
FIG. 1 is a schematic front view of a dual-valve automatic calibration system in one embodiment.
Figure 2:
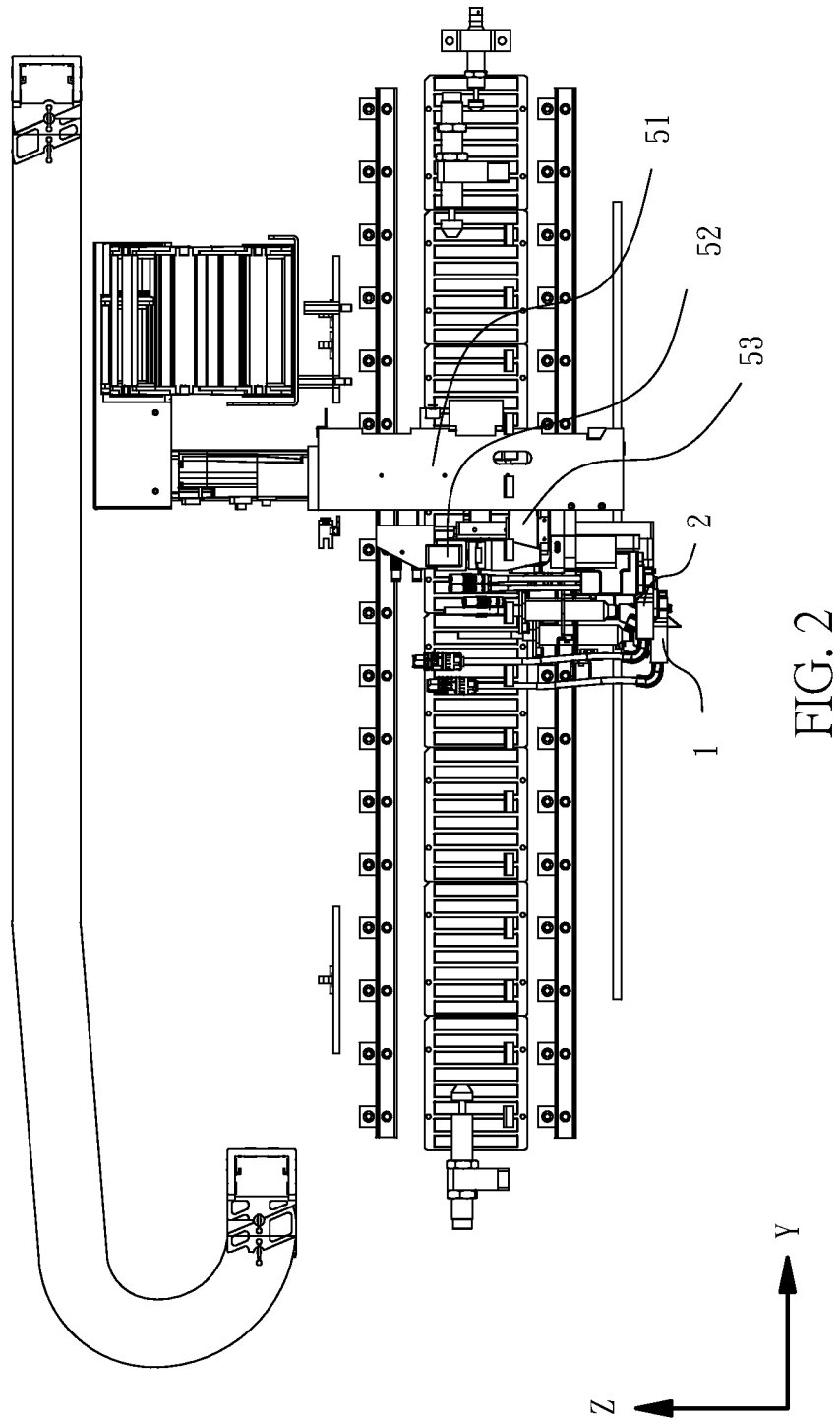
FIG. 2 is a schematic lateral view of a dual-valve automatic calibration system in one embodiment.

Referring to FIGS. 1 and 2, which are a schematic front view and a schematic lateral view of a dual-valve automatic calibration system in one embodiment, respectively. As shown in FIGS. 1 and 2, the dual-valve automatic calibration system comprises: a first fluid coating unit 1 with which fluids are coated on a first coating zone of a target circuit board; a second fluid coating unit 2 with which fluids are coated on a second coating zone of a target circuit board; a primary positioner 3 which comprises a primary X-axis positioner 31 and a primary Y-axis positioner 32 for movements and primary positioning of the first fluid coating unit 1 and the second fluid coating unit 2 in directions of the X-axis and the Y-axis; a first secondary positioner which comprises a first secondary Z-axis positioner 41 and joins the primary X-axis positioner 31 as well as the first fluid coating unit 1 for movements, secondary positioning and automatic calibrations of the first fluid coating unit 1 in the direction of the Z-axis; a second secondary positioner 5 which comprises a secondary X-axis positioner 52, a secondary Y-axis positioner 53 and a second secondary Z-axis positioner 51 and joins the primary X-axis positioner 31 as well as the second fluid coating unit 2 for movements, secondary positioning and automatic calibrations of the second fluid coating unit 2 in three directions of the X-axis, the Y-axis and the Z-axis.

The dual-valve automatic calibration system includes, without limitation, components explained hereinafter in detail.

Dual-Valve Fluid Coating Unit

In the dual-valve automatic calibration system, the so-called dual valves mean two sprayer valves adopted in the system for a synchronous coating operation; in the present disclosure, the dual valves can be two fluid coating units, for example, the dual valves in one embodiment are the first fluid coating unit 1 and the second fluid coating unit 2, each of which is not limited to a specific valve in structure but any type of valve for a user's expected applications such as air-operated needle valve or nozzle, pneumatic injection valve and coating valve in which fluids are stored. Moreover, the first fluid coating unit 1 and the second fluid coating unit 2 are identical or dissimilar to each other in structure and fluids can be designated as but not limited to gases or liquids which are soldering pastes, under-fill materials, adhesives or sealants. In one embodiment, each of the first fluid coating unit 1 and the second fluid coating unit 2 is designed as a dispensing valve in which adhesive fluids are stored.

Positioner

In the dual-valve automatic calibration system, the so-called positioner is a device with which a fluid coating unit is shifted to a specific location along a straight line or a curve during one translation or one slip. In the present disclosure, positioners comprises the primary positioner 3, the first secondary positioner and the second secondary positioner 5 wherein a shift of the primary positioner 3 can be translated to a secondary positioner and a fluid coating unit connected with the secondary positioner. For shifts and positioning in the direction of the X-axis, the Y-axis or the Z-axis, a positioner which is unrestricted in structure comprises a support component, a guiding component, a track, a carriage, etc.

Primary Positioner

In the dual-valve automatic calibration system, the primary positioner 3 comprising the primary X-axis positioner 31 and the primary Y-axis positioner 32 for movements and primary positioning of the first fluid coating unit 1 (the second fluid coating unit 2) in directions of the X-axis and the Y-axis is unrestricted in structure, for example, the primary positioner 3 is embodied by a series of controllable power-driven mechanisms in which at least a corresponding power-driven mechanism supplies a driving force in a specific direction of movement (the direction of the X-axis or the Y-axis) specifically. The primary positioner 3 and a secondary positioner are connected with each other; preferably, the primary X-axis positioner 31 and a secondary positioner are connected with each other or the primary Y-axis positioner 32 and a secondary positioner are connected with each other. In one embodiment, the primary positioner 3 is unable to move both the first fluid coating unit 1 and the second fluid coating unit 2 in the direction of the Z-axis and allows the primary X-axis positioner 31 and a secondary positioner to be connected with each other. Due to the above structural arrangement, the dual-valve automatic calibration system, which prevents a burden imposed on a primary Z-axis positioner as the prior art and promotes precision in Z-axis positioning in contrast to a traditional dual-valve dispensing device that features a secondary positioner is installed on a primary Z-axis positioner, contributes to overall positioning precision and dispensing efficiency by restraining interferences between the primary positioner 3 and a secondary positioner in the direction of the Z-axis.

In one embodiment, the primary X-axis positioner 31 of the primary positioner 3 and a secondary positioner are connected with each other such that a shift, $X_1$, in the direction of the X-axis and a shift, $Y_1$, in the direction of the Y-axis, both of which are attributed to the primary positioner 3, are translated to the secondary positioner for completion of primary positioning of dual valves connected with the secondary positioner.

First Secondary Positioner

In the dual-valve automatic calibration system, a secondary positioner is able to initiate an extra shift relative to the primary positioner 3. Moreover, each of the dual-valve fluid coating units is equipped with a separate secondary positioner, that is, the first fluid coating unit 1 and the second fluid coating unit 2 are connected with the first secondary positioner and the second secondary positioner, respectively. The first secondary positioner comprising the first secondary Z-axis positioner 41 is connected with the primary X-axis positioner 31 and the first fluid coating unit 1 such that the first fluid coating unit 1 moves in the direction of the Z-axis for secondary positioning and automatic calibrations.

In one embodiment, the first secondary positioner is unable to move the first fluid coating unit 1 in directions of the X-axis and the Y-axis. Due to the above structural arrangement, interferences between two sets of secondary positioners in directions of the X-axis and Y-axis are restrained for promotion of overall positioning precision and dispensing efficiency.

In one embodiment, the first fluid coating unit 1 relies on the primary positioner 3 to perform primary positioning in directions of $X_1$ and $Y_1$ first and the first secondary Z-axis positioner 41 to perform secondary positioning and calibrations in the direction of $Z_1$. Due to the above structural arrangement, interferences between the primary positioner 3 and the first secondary positioner in directions of the X-axis, the Y-axis and the Z-axis are restrained for promotion of positioning precision and dispensing efficiency.

Second Secondary Positioner

In the dual-valve automatic calibration system, the second secondary positioner 5 comprising the secondary X-axis positioner 52, the secondary Y-axis positioner 53 and the second secondary Z-axis positioner 51 is connected with the primary X-axis positioner 31 and the second fluid coating unit 2 for movements, secondary positioning and automatic calibrations of the second fluid coating unit 2 in directions of the X-axis, the Y-axis and the Z-axis.

In one embodiment, the second fluid coating unit 2 relies on the primary positioner 3 to perform primary positioning in directions of $X_1$ and $Y_1$ first and the secondary X-axis positioner 52, the secondary Y-axis positioner 53 and the second secondary Z-axis positioner 51 to perform secondary positioning and calibrations in directions of the $X_2$, $Y_2$ and $Z_2$, respectively. For that matter, the shifts in directions of $X_2$ and $Y_2$ completed by the secondary positioners are more fine-tuned and limited than the shifts in directions of the $X_1$ and $Y_1$ completed by the primary positioner 3. Due to the above structural arrangement, interferences between two sets of secondary positioners are restrained for promotion of overall positioning precision and dispensing efficiency.

In the second secondary positioner 5 of the dual-valve automatic calibration system, the secondary X-axis positioner 52, the secondary Y-axis positioner 53 and the second secondary Z-axis positioner 51 are not limited to one another's locations. Referring to FIGS. 1 and 2, which illustrate the second secondary Z-axis positioner 51 joining the primary X-axis positioner 31 supports both the secondary X-axis positioner 52 and the secondary Y-axis positioner 53 in one embodiment and both the secondary X-axis positioner 52 and the secondary Y-axis positioner 53 are connected with the second fluid coating unit 2. Due to the above structural arrangement, calibration precision in each direction of the X-axis and the Y-axis is promoted with the secondary X-axis positioner 52 (the secondary Y-axis positioner 53) getting closer to the second fluid coating unit 2.

Figure 3:
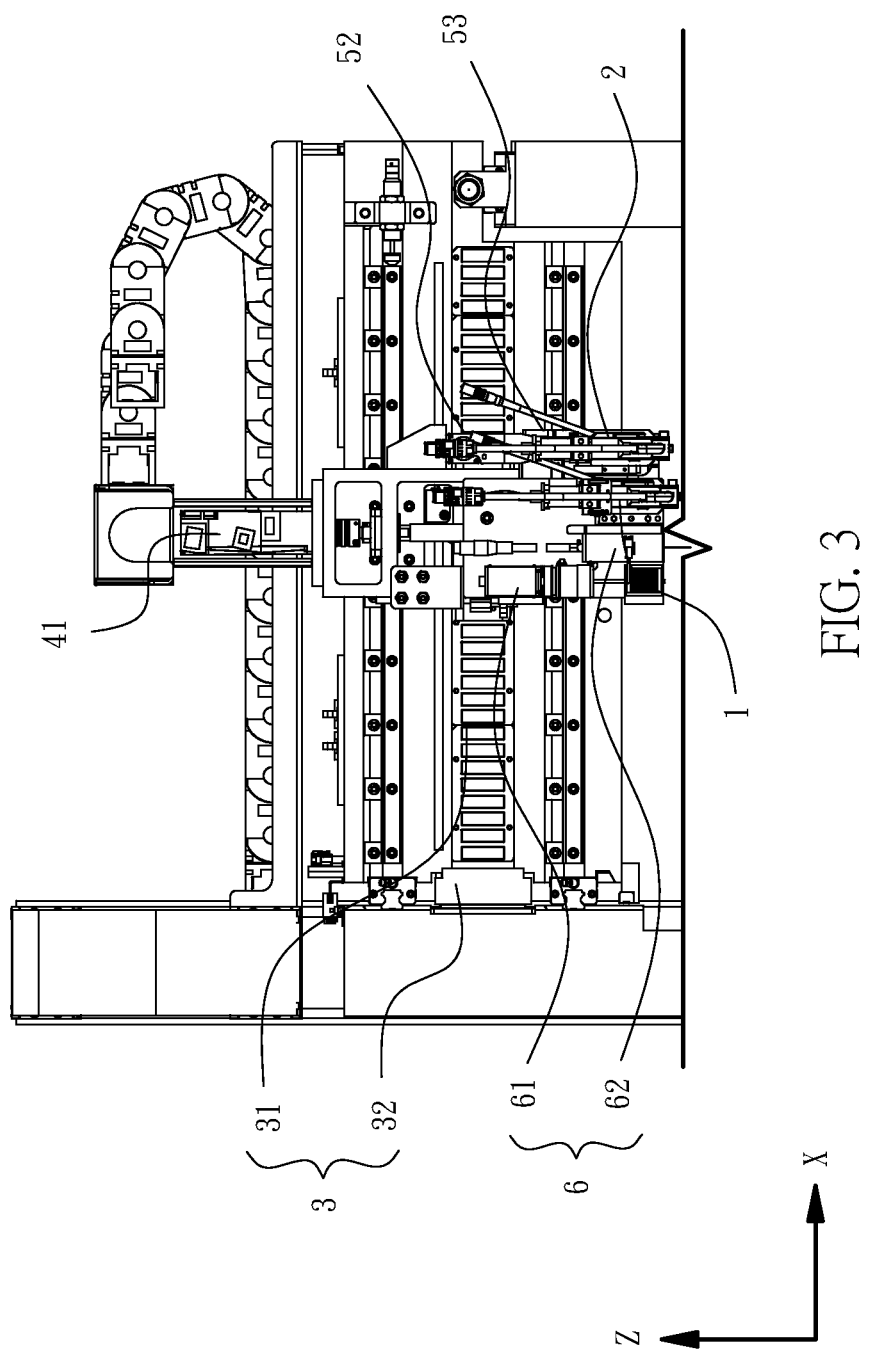
FIG. 3 is a schematic front view of a dual-valve automatic calibration system in another embodiment.
Figure 4:
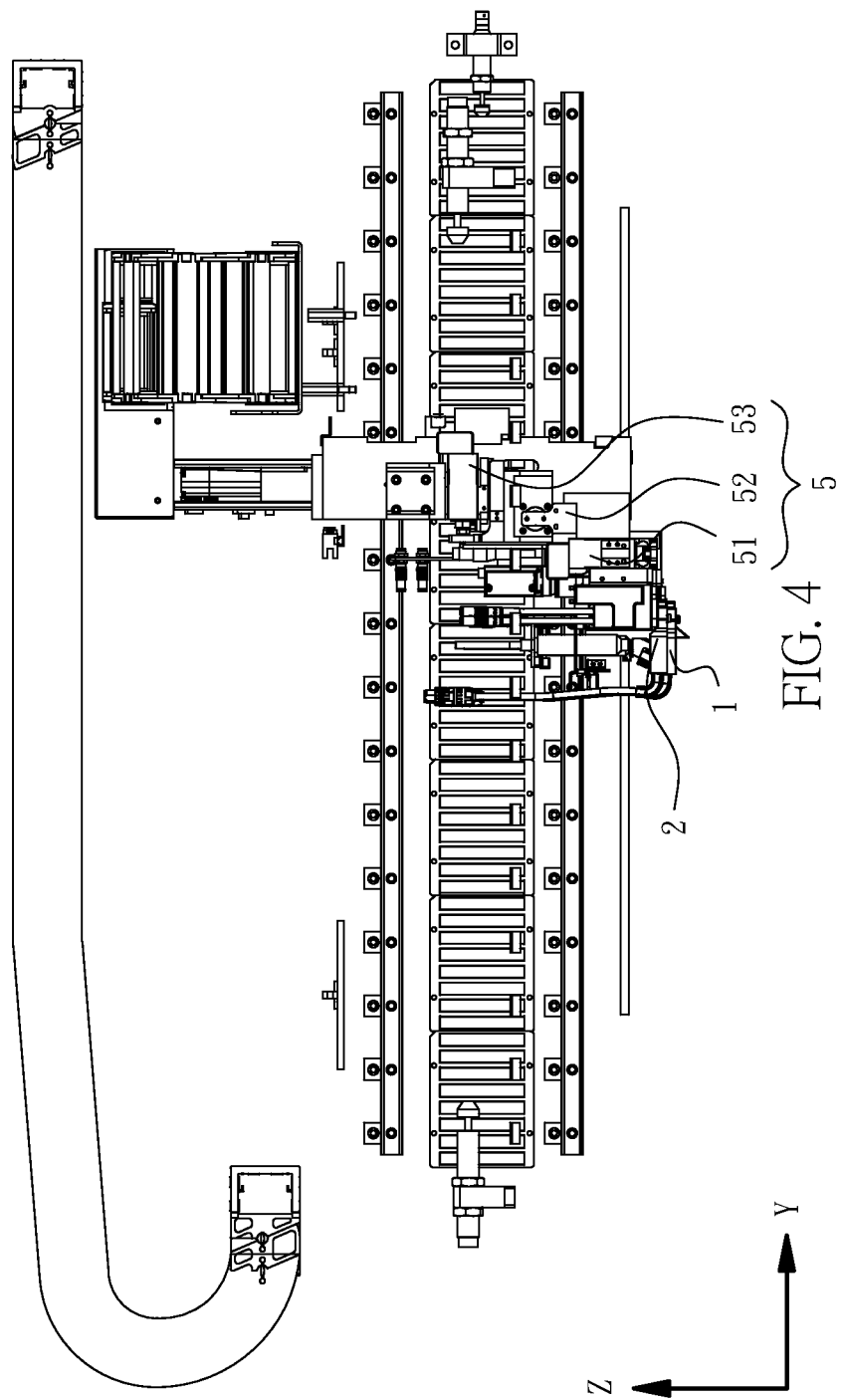
FIG. 4 is a schematic lateral view of a dual-valve automatic calibration system in another embodiment.

Referring to FIGS. 3 and 4, which illustrate both the secondary X-axis positioner 52 and the secondary Y-axis positioner 53 in the second secondary positioner 5 join the primary X-axis positioner 31 and support the second secondary Z-axis positioner 51 connected with the second fluid coating unit 2 in another embodiment. Due to the above structural arrangement, calibration precision in the direction of the Z-axis is promoted with the secondary Z-axis positioner 51 getting closer to the second fluid coating unit 2.

Optical Element

In one embodiment, the dual-valve automatic calibration system further comprises an optical element 6 with which a first coating zone and a second coating zone on a target circuit board are detected. Specifically, the optical element 6 as an elevation sensor is used in detecting Z-axis conditions in each position on the XY plane of a target circuit board wherein the Z-axis conditions in each position comprises obliquity and unevenness of a target circuit board relative to the XY plane. In this case, the first fluid coating unit 1 and the second fluid coating unit 2 are positioned properly after multiple Z-axis conditions for obliquity and unevenness on the substrate are detected by the optical element 6. In one embodiment, the optical element 6 can be a laser sensor containing a charge coupled device (CCD) 61 or laser 62.

Due to the above structural arrangement, the first fluid coating unit 1 and the second fluid coating unit 2 initiate movements relative to each other in directions of the X-axis, the Y-axis and the Z-axis for completion of positioning and calibrations such that a fluid-based pattern is precisely coated on the first coating zone and the second coating zone of a target circuit board by the first fluid coating unit 1 and the second fluid coating unit 2, respectively. In one embodiment, the fluid-based pattern which can be one or more lines, curves, points, shapes or a combination thereof is dispensed through continuous coating, intermittent coating, miscellaneous coating or a combination thereof. In one embodiment for which the first fluid coating unit 1 and the second fluid coating unit 2 are identical to each other in structure, fluids will be precisely coated on a target circuit board unaligned (i.e., oblique or uneven) by the two fluid coating units for consistency in positions, dimensions and shapes of fluid-based patterns in practice after completion of automatic calibrations.

Each of the primary positioner 3 and a secondary positioner is separately controlled by at least a control device (not shown in figures): positioning in the direction of $X_1$ ($Y_1$) is initiated by the primary positioner 3 under guidance of at least an actuating device regulated with the control device; positioning in the direction of $Z_1$ is initiated by the first secondary positioner under guidance of an actuating device regulated with the control device; positioning in the direction of $X_2$ ($Y_2$ or $Z_2$) is initiated by the second secondary positioner 5 under guidance of at least an actuating device regulated with the control device. Due to the above structural arrangement, fluids are coated on a target circuit board unaligned (i.e., oblique or uneven) precisely by the first fluid coating unit 1 and the second fluid coating unit 2, both of which are positioned and calibrated controllably and flexibly.

In the case of the dual-valve automatic calibration system comprising the optical element 6 for detections of the first coating zone and the second coating zone on a target circuit board, the Z-axis conditions for obliquity and unevenness on a substrate are detected by the optical element 6 and transmitted to the control device with which the positioning operation is initiated by the primary positioner 3 and a secondary positioner based on the multiple Z-axis conditions supplied by the optical element 6.

Dual-Valve Automatic Calibration Method

A dual-valve automatic calibration method in the present disclosure comprises: information for positions of the first coating zone and the second coating zone on a target circuit board is detected such that the first fluid coating unit 1 (the second fluid coating unit 2) moves in directions of the X-axis and the Y-axis through the primary positioner 3 for primary positioning; first-error information corresponding to first obliquity or first unevenness of the first coating zone on a target circuit board is detected such that the first fluid coating unit 1 moves in the direction of the Z-axis through the first secondary positioner for secondary positioning and automatic calibrations; second-error information corresponding to second obliquity or second unevenness of the second coating zone on a target circuit board is detected such that the second fluid coating unit 2 moves in directions of the X-axis, the Y-axis and the Z-axis for secondary positioning and automatic calibrations through the second secondary positioner 5.

In one embodiment, the Z-axis conditions for the first coating zone and the second coating zone on a target circuit board are detected for controllable positioning through the primary positioner 3 and a secondary positioner.

In one embodiment, the primary positioner 3 is unable to move both the first fluid coating unit 1 and the second fluid coating unit 2 in the direction of the Z-axis for interferences between the primary positioner 3 and a secondary positioner restrained and promotion of overall positioning precision as well as dispensing efficiency.

In one embodiment, the first secondary positioner is unable to move the first fluid coating unit 1 in directions of the X-axis and the Y-axis for interferences between two sets of secondary positioners restrained and promotion of overall positioning precision as well as dispensing efficiency.

In summary, the dual-valve automatic calibration system in which no secondary positioner is installed on a primary Z-axis positioner proves effective in abating a burden imposed on the primary Z-axis positioner and promoting overall positioning precision in the direction of the Z-axis. Moreover, each of two sets of fluid coating units in the present disclosure corresponds to a separate secondary positioner and a secondary Z-axis positioner included in the separate secondary positioner for no movement of each fluid coating unit in directions of the X-axis and the Y-axis, interferences between the two sets of secondary positioners restrained, and promotion of overall positioning precision as well as dispensing efficiency. Due to the structural arrangement, the primary positioner is unable to move two sets of fluid coating units in the direction of the Z-axis for no interference between two structures of the primary positioner and a secondary positioner in the direction of the Z-axis as well as promotion of overall positioning precision and dispensing efficiency.

The specific exemplary embodiments disclosed hereinbefore are aimed to describe technical content in the present disclosure but not taken as evidences to restrict claims hereinafter. Any equivalent substitution, modification or change depending on embodiments of the patent specification disclosed herein and made by a person with common knowledge in the art is incorporated into and not departing from the scope of claims.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A dual-valve automatic calibration system, comprising:
a first fluid coating unit with which fluids are coated on a first coating zone of a target circuit board;
a second fluid coating unit with which fluids are coated on a second coating zone of a target circuit board;
a primary positioner which comprises a primary X-axis positioner and a primary Y-axis positioner for movements and primary positioning of the first fluid coating unit as well as the second fluid coating unit in directions of the X-axis and the Y-axis;
a first secondary positioner which comprises a first secondary Z-axis positioner for movements, secondary positioning and automatic calibrations of the first fluid coating unit in the direction of the Z-axis, the first secondary positioner connecting to the primary X-axis positioner; and
a second secondary positioner which comprises a secondary X-axis positioner, a secondary Y-axis positioner and a second secondary Z-axis positioner for movements, secondary positioning and automatic calibrations of the second fluid coating unit in three directions of the X-axis, the Y-axis and the Z-axis, the second secondary positioner connecting to the primary X-axis positioner, wherein the first secondary Z-axis positioner moves the first fluid coating unit in the direction of the Z-axis separately from the second fluid coating unit, and the second secondary Z-axis positioner moves the second fluid coating unit in the direction of the Z-axis separately from the first fluid coating unit.

2. The dual-valve automatic calibration system as claimed in claim 1 wherein the primary positioner is unable to move both the first fluid coating unit and the second fluid coating unit in the direction of the Z-axis.

3. The dual-valve automatic calibration system as claimed in claim 1 wherein the first secondary positioner is unable to move the first fluid coating unit in directions of the X-axis and the Y-axis.

4. The dual-valve automatic calibration system as claimed in claim 1 wherein the second secondary Z-axis positioner in the second secondary positioner joins the primary X-axis positioner and supports the secondary X-axis positioner as well as the secondary Y-axis positioner, both of which are connected with the second fluid coating unit.

5. The dual-valve automatic calibration system as claimed in claim 1 wherein both the secondary X-axis positioner and the secondary Y-axis positioner in the second secondary positioner join the primary X-axis positioner and support the second secondary Z-axis positioner connected with the second fluid coating unit.

6. The dual-valve automatic calibration system as claimed in claim 1 wherein the dual-valve automatic calibration system further comprises an optical element with which a first coating zone and a second coating zone on a target circuit board are detected.

7. The dual-valve automatic calibration system as claimed in claim 6 wherein the optical element comprises a charge coupled device (CCD) and a laser sensor.

8. The dual-valve automatic calibration system as claimed in claim 6 wherein the optical element is an elevation sensor used in detecting Z-axis conditions in each position on an XY plane of the target circuit board.

9. The dual-valve automatic calibration system as claimed in claim 8 wherein the Z-axis conditions in each position on the XY plane of the target circuit board include obliquity and unevenness.

10. The dual-valve automatic calibration system as claimed in claim 9 wherein the Z-axis conditions for obliquity and unevenness on the target circuit board are detected by the optical element and transmitted to a control device with which a positioning operation is initiated by the primary positioner and at least one of the first secondary positioner and the second secondary positioner based on the Z-axis conditions supplied by the optical element.

11. The dual-valve automatic calibration system as claimed in claim 1 wherein each of the first fluid coating unit and the second fluid coating unit includes an air-operated valve or a pneumatic injection valve.

12. The dual-valve automatic calibration system as claimed in claim 1 wherein each of the first fluid coating unit and the second fluid coating unit are identical in structure.

13. The dual-valve automatic calibration system as claimed in claim 1 wherein each of the first fluid coating unit and the second fluid coating unit dispense soldering paste, under-fill material, adhesive, or sealant.

14. The dual-valve automatic calibration system as claimed in claim 1 wherein each of the first fluid coating unit and the second fluid coating unit dispense the same fluid.

\* \* \* \* \*